United States Patent [19]

Thompson

[11] Patent Number: 4,532,643
[45] Date of Patent: Jul. 30, 1985

[54] BIDIRECTIONAL ONE-HALF RATE COUNTER

[75] Inventor: Ralph A. Thompson, Warren, Mich.

[73] Assignee: General Motors Corporation, Detroit, Mich.

[21] Appl. No.: 419,936

[22] Filed: Sep. 20, 1982

[51] Int. Cl.³ .................... H03K 23/26; H03K 21/32; H03K 21/36; G06M 1/27
[52] U.S. Cl. .................................. 377/45; 377/31; 377/47; 377/85
[58] Field of Search ............. 377/3, 16, 17, 31, 33, 377/45, 47, 53, 85; 364/770

[56] References Cited

U.S. PATENT DOCUMENTS 3,956,616  5/1976  Knollenberg .............. 377/45 X
3,986,003 10/1976  Pruessner .................. 377/45 X
4,021,646  5/1977  Meier ........................... 377/45
4,130,863 12/1978  Schweitzer et al. ........ 377/45 X
4,239,957 12/1980  Satoh et al. ................. 377/45
4,461,015  7/1984  Kulhavy ....................... 377/45 X Primary Examiner—Larry N. Anagnos
Attorney, Agent, or Firm—Albert F. Duke

[57] ABSTRACT

A bidirectional counting circuit for use with a transducer producing two pulses per engineering unit includes an UP/DOWN counter which receives separate UP and DOWN input pulses from the transducer through respective AND gates. A synchronizing flip-flop, which switches states in response to either an UP or DOWN pulse, alternately enables the AND gates and effectively divides the input pulses by two. The state of the flip-flop is used to control a display digit to add the suffix "5" or "0" to the displayed counter content in order to display one-half engineering unit resolution. The circuit includes automatic and manual zeroing capability and a direction indicator.

4 Claims, 2 Drawing Figures

BIDIRECTIONAL ONE-HALF RATE COUNTER

FIELD OF THE INVENTION

This invention relates to counting circuits and, more particularly, to a bidirectional one-half rate counter.

BACKGROUND OF THE INVENTION

Prior art bidirectional counters usually increment the count by one in response to a pulse from a transducer indicating movement in one direction and decrement the count by one in response to a pulse from the transducer indicating movement in the other direction. In certain applications, such as for example where the counter is used to display mirror position in an interferometer system, a linear displacement transducer may be employed which provides two output pulses per unit of motion. Also, it is often desirable to display rotary position to one-half degree accuracy with a 720 pulse per revolution rotary encoder. In such situations, it is necessary to divide the displayed number by two. The mere introduction of a divide-by-two circuit ahead of the counting circuits does not provide an acceptable solution, since if motion is reversed the count can be an error by one-half unit.

SUMMARY OF THE INVENTION

With the foregoing in mind, it is an object of the present invention to provide a one-half rate counting circuit which maintains correct position read-out for bidirectional motion of a transducer.

It is another object of the present invention to provide a bidirectional counting circuit adapted to respond to a transducer producing two output pulses per engineering unit in order to accurately display position with one-half engineering unit resolution.

To attain the above objects, according to the invention, a synchronizing memory element responds to both UP and DOWN input pulses from a transducer and keeps track of whether to pass or ignore the first pulse in the opposite direction when transducer motion is reversed. The state of the memory element is then employed to control a display digit to add the suffix "5" or "0" to the displayed counter content so as to provide and display one-half engineering unit resolution.

Other objects of the present invention will be more apparent from the following detailed description which should be read in conjunction with the drawings, in which:

DESCRIPTION OF THE PREFERRED EMBODIMENT

Figure 1:
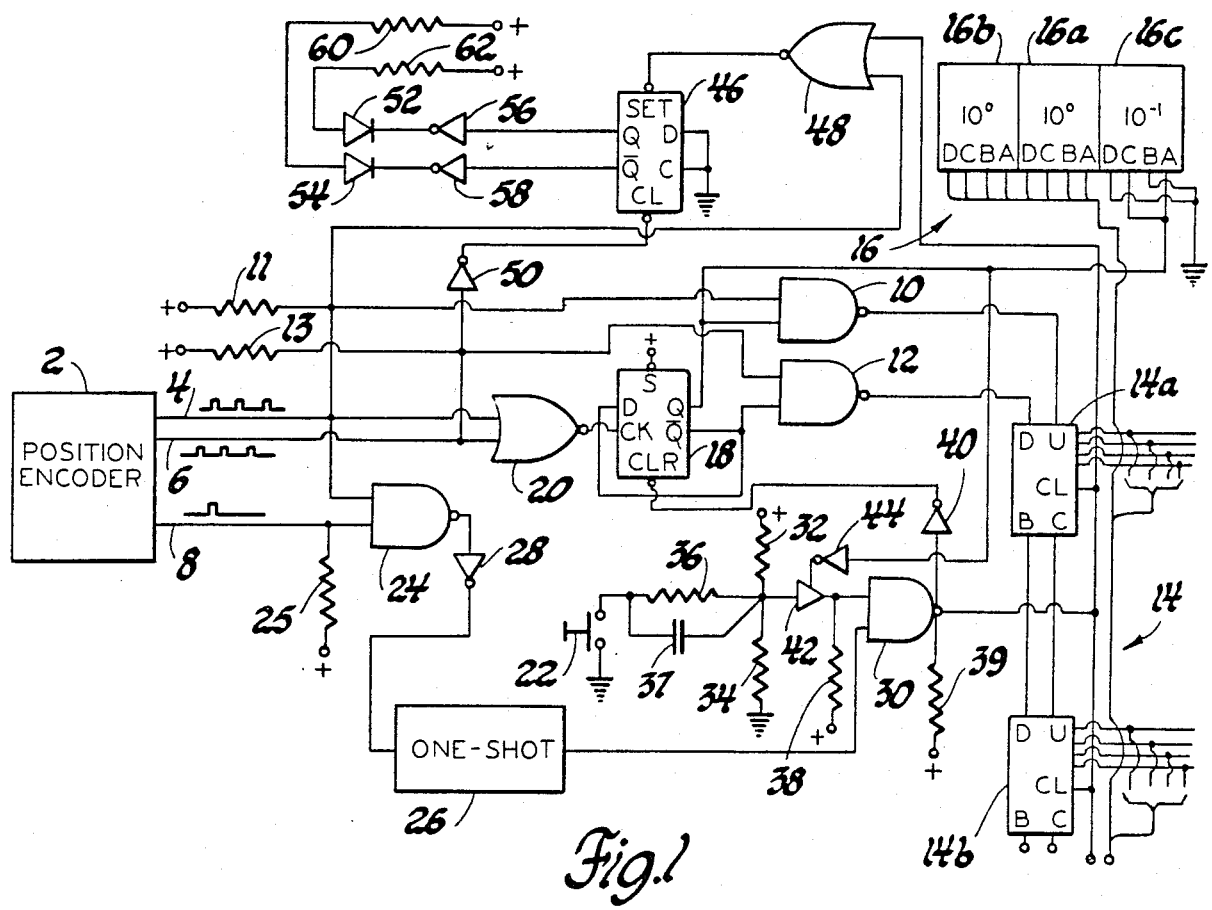
FIG. 1 is a schematic diagram of the counting circuit of the present invention.

Referring now to the drawings and initially to FIG. 1, the counting circuit is adapted to receive separate UP and DOWN pulse outputs from a transducer or position encoder generally designated 2. The UP pulses appear on conductor 4 and represent motion, of the transducer and thus the device being monitored, in one direction while the DOWN pulses appear on conductor 6 and represent motion in the other direction. The transducer 2 is of the type that produces two output pulses for each unit movement of the device, for example, two pulses per micron. The transducer 2 also provides a single pulse marker output for the zero reference position on conductor 8. The UP and DOWN pulse signals pass through separate control gates 10 and 12 in route to the inputs of an up/down counter 14. Pull-up resistors 11 and 13 are connected to a positive voltage terminal. The counter 14 may comprise a number of stages, but only the first and second 14a and 14b are shown in the schematic. Individual BCD displays, generally designated 16, are connected with the counter 14. Two display digits are designated 16a and 16b and are connected with the counter stages 14a and 14b. The gates 10 and 12 are controlled by the Q and $\overline{Q}$ outputs of flip-flop 18. Both the UP and DOWN pulse outputs are fed to the clock input of the flip-flop 18 through NOR gate 20. The $\overline{Q}$ output of the flip-flop 18 is connected with its D-input so that each pulse input from either of the input lines 4 or 6 causes the flip-flop 18 to change state. Thus, the flip-flop 18 alternately enables one of the input gates 10,12 and then the other on successive input pulses from either input line. The effect of these alternately enabled gates is a division by two of the input pulse rate for continuous motion of the transducer 2 in one direction.

Figure 2:
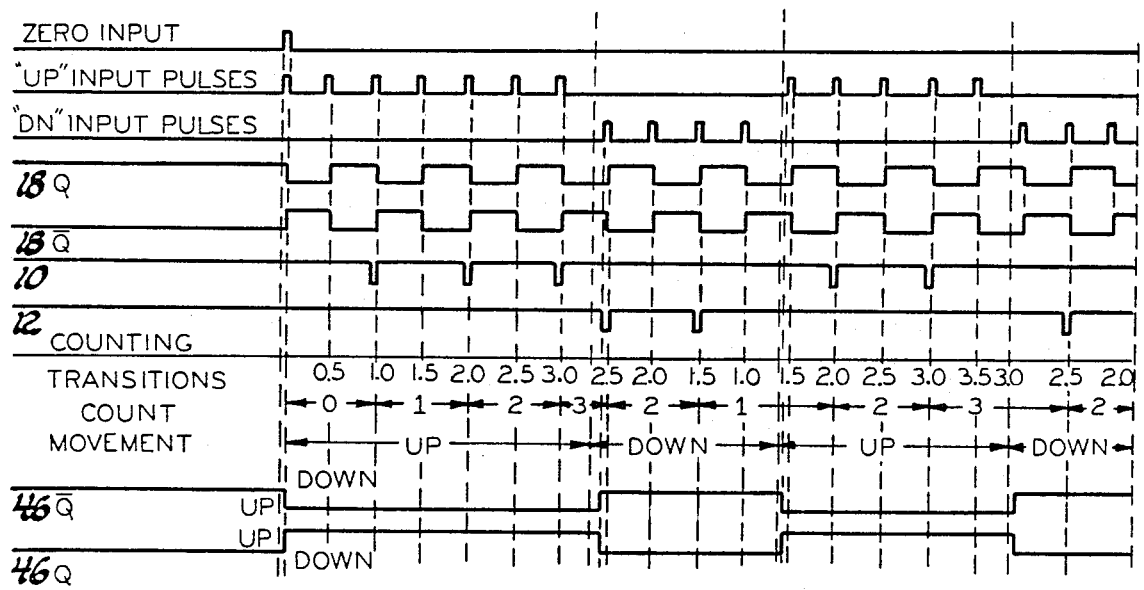
FIG. 2 is a timing diagram useful in understanding the invention.

It will be noted from the timing diagram of FIG. 2 that in all cases, for either UP or DOWN motion of the transducer, the Q-output of the flip-flop 18 is at a one logic level while the position of the transducer is between a half increment mark and the next higher full increment mark. Thus, the state of the flip-flop 18 may be used to display one-half unit resolution. For this purpose, the Q-output of the flip-flop 18 is connected to the A and C input of a display 16c, having its B and D-inputs wired to ground. When the Q-output of flip-flop 18 is a one, a "5" will be displayed in the display 16c. When the Q-output of flip-flop 18 is zero, a "0" will be displayed. A decimal point is added between the least significant digit 16a of the display and the decimal digit 16c so that the display reads ... XX.0 or ... XX.5.

The flip-flop 18 and the counter stages 14a, 14b are initialized from the automatic zero pulse provided on conductor 8, or from a manual zero switch 22. The conductor 8 is connected with a NAND gate 24 which also receives an input from the UP pulse line 4 and performs an AND function. Pull-up resistor 25 is connected between line 8 and the supply positive terminal. The output of the gate 24 is fed to a one-shot multivibrator 26 through an inverter 28. The output of the one-shot 26 provides one input to a NAND gate 30 which performs an OR function. The other input to the gate 30 is from the switch 22 through a network comprising resistors 32, 34 and 36 and capacitor 37. Pull-up resistors 38 and 39 are connected to positive supply. The output of the gate 30 is connected to the CLEAR input of the counter stages 14a,14b with the CLEAR input of the flip-flop 18 through an inverter 40. A tri-state gate 42 is interposed between the zero switch 22 and the gate 30 and has its control input connected through an inverter 44 to the Q-output of the flip-flop 18. When the Q-output of flip-flop 18 is at the logic one level, indicating that the transducer is between a half micron mark and the next higher full micron mark, the tri-state gate 42 is disabled and a manual zeroing operation cannot be initiated. The tri-state is enabled when the half-digit output is indicating "zero" and the transducer is between a whole micron and the next higher half micron mark. This feature prevents the user from incorrectly setting an up-scale zero on a one-half micron mark with reference to the transducer absolute zero.

The AND function performed by the gate 24 ensures that the system can only be initialized during an UP input pulse on line 4. This prevents false zeroing by noise pulses on the zero pulse line 8. The one-shot 26 triggers on the trailing edge of the zero input pulse and thus ensures that the zeroing operation occurs after the coincident UP pulse has passed. The one-shot period should be long enough to hold overriding control of the counter 14 well past the trailing edge of the UP counting pulse in order to prevent the system from starting with an initial error of one count.

A direction indicator comprises a flip-flop 46 which serves as a memory element for indicating "UP" or "DOWN" motion of the device being monitored. Conductor 4 and the output of gate 30 provide inputs to NOR gate 48 which control the set input of the flip-flop 46. Conductor 6 is connected to inverter 50 which in turn is connected to the clear input of flip-flop 46. UP pulses set flip-flop 46 and DOWN pulses reset or clear it. The Q and $\overline{Q}$ outputs of flip-flop 46 control light emitting diodes 52 and 54 through two open-collector inverters 56 and 58. The diodes 52 and 54 are connected to a positive supply terminal through resistors 60 and 62. The direction indicator is initialized to indicate "UP" motion at the zero reference position from gate 30 through gate 48 which performs an OR function.

The embodiments of the invention in which an exclusive property or privilege is claimed are defined as follows:

1. A half-rate bidirectional counting circuit comprising an up/down counter having an UP input and a DOWN input, first and second gate means connected with a source of UP pulses and a source of DOWN pulses, respectively, for respectively gating said UP and DOWN pulses to said UP and DOWN inputs, bistable means for alternately enabling said first and second gate means in response to either an UP or DOWN pulse and means for initializing said bistable means and said counter.

2. A bidirectional counting circuit having a first circuit input and a second circuit input for receiving pulses representing motion of a device in first and second directions, respectively, counter means having a first counter input and a second counter input, said counter means being incremented in response to a pulse at said first counter input and decremented in response to a pulse at said second counter input, first gate means connected between said first circuit input and said first counter input, second gate means connected between said second circuit input and said second counter input, bistable circuit means for alternately enabling said first and second gate means in response to pulses at either said first or second circuit inputs, means for initializing said counter means and said bistable circuit means, first display means for displaying the content of said counter means, and second display means for displaying the digit "0" or the digit "5" depending upon the state of said bistable circuit means.

3. A half rate bidirectional counting circuit comprising an up/down counter having an UP input and a DOWN input, first and second gate means connected with a source of UP and DOWN pulses respectively for respectively gating said UP and DOWN pulses to said UP and DOWN inputs, a synchronizing flip-flop for alternately enabling said first and second gate means in response to either an UP or DOWN pulse, up/down indicator means, an up/down flip-flop responsive to said UP and DOWN pulses for controlling said indicator means, circuit means for initializing said counter means, said synchronzing flip-flop, and said up/down flip-flop in response to a reference pulse, means for displaying the content of said counter means and for displaying the digit "0" or the digit "5" as a suffix to the displayed counter content depending upon the state of said synchronizing flip-flop.

4. The circuit of claim 3 further comprising a manually operative zeroing switch, said initializing circuit means being responsive to operation of said switch, means responsive to a predetermined state of said synchronizing flip-flop for disabling said switch.

* * * * *